United States Patent [19]

Nakao

[11] Patent Number: 5,896,342
[45] Date of Patent: Apr. 20, 1999

[54] SEMICONDUCTOR MEMORY DEVICE HAVING COLLECTIVE WRITING MODE FOR WRITING DATA ON ROW BASIS

[75] Inventor: Hiroyuki Nakao, Hyogo, Japan

[73] Assignee: Mitsubishi Denki Kabushiki Kaisha, Tokyo, Japan

[21] Appl. No.: 08/907,778

[22] Filed: Aug. 11, 1997

[30] Foreign Application Priority Data

Feb. 18, 1997 [JP] Japan ................... 9-033640

[51] Int. Cl.$^6$ ................................ G11C 8/00
[52] U.S. Cl. ................ 365/230.06; 365/230.03; 365/238.5; 365/201
[58] Field of Search ............... 365/230.06, 230.03, 365/238.5, 201

[56] References Cited

U.S. PATENT DOCUMENTS 4,654,849  3/1987  White, Jr. et al. ................ 371/21.1
5,490,115  2/1996  Shah et al. ........................ 365/201
5,712,823  1/1998  Gillingham ....................... 365/203
5,721,709  2/1998  Nakamura ..................... 365/230.06

FOREIGN PATENT DOCUMENTS 63-102094  5/1988  Japan ................ G11C 11/34

*Primary Examiner*—David Nelms
*Assistant Examiner*—Andrew Q. Tran
*Attorney, Agent, or Firm*—McDermott, Will & Emery

[57] ABSTRACT

In a DRAM column decoder, an OR gate receiving a test signal and an output of a column decoder unit circuit is provided corresponding to each column select line. When test signal is at the active "H" level, all column select lines attain the "H" level and all column select gates are rendered conductive, allowing collective writing row by row. A separate circuit for collective writing is not required, so that the layout area is reduced.

12 Claims, 7 Drawing Sheets

SEMICONDUCTOR MEMORY DEVICE HAVING COLLECTIVE WRITING MODE FOR WRITING DATA ON ROW BASIS

BACKGROUND OF THE INVENTION

1. Field of the Invention

The present invention relates to a semiconductor memory device and more particularly to a semiconductor memory device having a collective writing mode for writing data row by row.

2. Description of the Background Art

FIG. 8 is a partially omitted circuit diagram showing a structure of a conventional dynamic random access memory (hereinafter referred to as a DRAM). Such a DRAM is disclosed, for example, in Japanese Patent Laying-Open No. 63-102094.

Referring to FIG. 8, the DRAM includes a memory array MA, a sense amplifier SA, a column select gate CSG, a row decoder 101, a word driver 102, a column predecoder 103, a column decoder 104, a write circuit 105 and a read circuit 106.

Memory array MA includes a plurality of memory cells MC arranged in row and column directions, a word line WL provided corresponding to each row, and a bit line pair BL, /BL provided corresponding to each column. Well known memory cells MC are used each including an N channel MOS transistor for access and a capacitor for storing data.

Sense amplifier SA is provided corresponding to each bit line pair BL, /BL, and it amplifies a slight potential difference caused between bit lines BL, /BL according to data in selected memory cell MC when the reading operation is performed. Column select gate CSG is provided corresponding to each bit line pair BL, /BL, and it includes N channel MOS transistors 107, 108 each connected between a corresponding one of bit lines BL, /BL and a corresponding one of data input/output lines IO, I/O. Gates of N channel MOS transistors 107, 108 are connected to column decoder 104 through a column select line CSL. Row decoder 101 selects one word line WL in memory array MA. Word driver 102 raises the word line WL selected by row decoder 101 to a selected level, that is an "H level, for a prescribed time period, and activates each memory cell MC connected to the word line WL. Column predecoder 103 generates a column predecode signal in response to a column address signal CA, and supplies it to column decoder 104. Column decoder 104 raises column select line CSL designated by the column predecode signal to the selected level of "H", rendering conductive column select gate CSG corresponding to that column select line CSL.

In response to a write control signal W, write circuit 105 writes externally supplied data DI to selected memory cell MC. In response to a read control signal R, read circuit 106 outputs data DO read out of selected memory cell MC to the outside.

Here, normal operation of the DRAM will be briefly described. In the writing operation, column select line CSL designated by column address signal CA is raised to the selected "H" level by column decoder 104, rendering conductive column select gate CSG corresponding to the column select line CSL. Then, write circuit 105 raises or lowers data input/output lines IO, /IO and bit lines BL,/BL electrically connected to them to a potential according to the external data DI, that is, a power supply potential Vcc or a ground potential GND. Then, word line WL designated by row address signal RA is raised to the selected "H" level by word driver 102, activating each memory cell MC corresponding to the word line WL. The potential of bit line BL or /BL electrically connected to data input/output line IO or /IO, that is, data DI is written in the form of charges to a capacitor of activated memory cell MC.

In the reading operation, an equalize circuit, not shown, equalizes a potential of each one of bit lines BL, /BL to an intermediate potential Vcc/2 and, thereafter, word line WL designated by row address signal RA is raised to the selected "H" level by word driver 102. Thus, each memory cell MC corresponding to the word line WL is activated, and the potentials of respective bit lines BL, /BL slightly vary according to the amount of charges in the capacitor of activated memory cell MC. Then, the potentials of respective bit lines BL, /BL are amplified to power supply potential Vcc or ground potential GND by corresponding sense amplifier SA. Column select line CSL designated by column address signal CA is raised to the selected "H" Level by column decoder 104, rendering conductive column select gate CSG corresponding to the column select line CSL. The potentials of data input/output line pairs IO, /IO are converted to data DO and output to the outside by read circuit 106.

Before shipment, such a DRAM needs to be tested to see if a defective memory cell MC exists in memory array MA. However, if the test is performed by writing and reading data for each memory cell MC as described above, test time and cost are increased. Therefore, the DRAM further includes a test circuit 110 for testing by writing and reading data row by row.

As shown in FIG. 8, test circuit 110 includes a test pattern write Control terminal 111, test pattern write terminals 112, 113, an output terminal 114, a test pattern write circuit 115, a test pattern write control gate 120, a comparison circuit 123, and an OR gate 126.

Test pattern write circuit 115 includes resistors 116, 117 and inverters 118, 119. Resistors 116, 117 are connected between test pattern write terminals 112, 113 and a line of power supply potential Vcc, respectively. Inverters 118, 119 are connected between test pattern write terminals 112, 113 and nodes N118, N119, respectively. In the normal reading and writing operations, terminals 112, 113 are both driven to a floating state, and nodes N118, N119 are both at the "L" level. In the test mode, one of terminals 112, 113 is supplied with the "L" level and one of nodes N118, N119 attains the "H" level.

Test pattern write control gate 120 is provided corresponding to each bit line pair BL, /BL, and it includes a pair of N channel MOS transistors 121, 122. N channel MOS transistors 121, 122 are connected between nodes N119, N118 and bit lines BL, /BL, respectively, and their gates are both connected to test pattern write control terminal 111. In the normal reading and writing operations, terminal 111 is supplied with the "L" level and N channel MOS transistors 121, 122 are rendered non-conductive. When the writing operation is performed in the test mode, terminal 111 is supplied with the "H" level, and N channel MOS transistors 121, 122, node N119 and all bit lines BL, as well as node N119 and all bit lines are rendered conductive.

Comparison circuit 123 is provided corresponding to each bit line pair BL, /BL, and it includes a pair of N channel MOS transistors 124, 125. N channel MOS transistors 124, 125 are connected between a node N123 and nodes N119, N118, respectively, and their gates are connected to a corresponding one of bit lines BL, /BL. During the reading operation in the test mode, one of test pattern write terminals 112, 113, other than the one which was supplied with the "L" level during the writing operation in the test mode, is supplied with the "L" level.

For example, if the "L" level is supplied to terminal 112 and the "H" level is supplied to bit line /BL during the writing operation in the test mode, bit line /BL is at the "H" level and N channel MOS transistor 125 is rendered conductive during the reading operation in test mode as well, provided that memory cells MC are normal. At this time, since the "L" level is supplied not to terminal 112 but to terminal 113 and node N118 is at the "L" level, output node N123 of comparison circuit 123 is at the "L" level. If memory cell MC is defective, bit line BL is at the "H" level and N channel MOS transistor 124 is rendered conductive during the reading operation in the test mode. Since the "L" level is supplied not to terminal 112 but to terminal 113 and node N119 attains to the "H" level at this time, output node 123 of comparison circuit 123 is also at the "H" level.

OR gate 126 includes an N channel MOS transistor 127 provided corresponding to each bit line pair BL, /BL, an N channel MOS transistor 128, and an inverter 129. N channel MOS transistor 127 is connected between a node N128 and the line of ground potential GND, and its gate is connected to output node N123 of corresponding comparison circuit 123. N channel MOS transistor 128 is connected between the line of power supply potential Vcc and node N128, and its gate receives a precharge signal φp. Inverter 129 is connected between node N128 and an output terminal 114 of test circuit 110.

First, precharge signal φp attains the "H" level for a prescribed time period and N channel MOS transistor 128 is rendered conductive, charging node N128 to the "H" level. When at least one output node N123 of comparison circuit 123 attains the "H" level, N channel MOS transistor 127 corresponding to the output node N123 is rendered conductive to discharge node N128 to the "L" level, and inverter 129 outputs an "H" level signal indicating the existence of a defective memory cell MC to output terminal 114.

Next, operation of the DRAM in the test mode will be briefly described. During the reading operation in the test mode, the "H" level is supplied to test pattern write control terminal 111, and test pattern write control gate 120 is rendered conductive, rendering conductive the paths between node N119 and all bit lines BL as well as node N118 and all bit lines /BL. One of test pattern write terminals 112, 113 is supplied with the "L" level, and one of bit lines BL, /BL is supplied with the "H" level and the other with the "L" level. Then, word line WL designated by row address signal RA is raised to the selected "H" level by word driver 102. Thus, all memory cells MC corresponding to that word line WL are activated and the same data is collectively written to each memory cell MC.

During the reading operation in the test mode, the inactive, that is, the "L" level is supplied to test pattern write control terminal 111, and test pattern write control gate 120 is rendered non-conductive, rendering conductive the paths between node N119 and bit line BL as well node N118 and bit line /BL. The "L" level is supplied to one of terminals 112, 113, other than the one which was supplied with the "L" level during the writing operation in the test mode, and word line WL designated by row address signal RA is raised to the selected "H" level by word driver 102, thus data of all memory cells MC corresponding to that word line WL is read out. If there should be any defective memory cell MC in those memory cells MC, output node N123 of comparison circuit 123 corresponding to the defective memory cell MC attains the "H" level, and node N128 is discharged to the "L" level, driving output terminal 114 to the "H" level. If all memory cells MC are normal, output nodes N123 of all comparison circuits 123 are at the "L" level and node N128 is kept precharged to the "H" level without being discharged, thus output terminal 114 is at the "L" level. Therefore, by detecting the level of output terminal 114, a determination can be made if a defective memory cell MC exists in each row. A row containing the defective memory cell MC is replaced by a spare row, not shown.

However, a conventional DRAM needs to be separately provided with test pattern write circuit 115, test pattern write control gate 120 and so on, in order to collectively write data row by row. Thus, it has a problem of increased layout area.

SUMMARY OF THE INVENTION

Therefore, a main object of the present invention is to provide a semiconductor memory device which allows collective writing on a per row basis and has a smaller layout area.

Briefly describing the semiconductor memory device in accordance with a first aspect of the present invention, in the collective writing mode, a column select circuit renders conductive all column select gates, and a write circuit collectively writes data row by row through the column select gates. Therefore, the layout area is smaller than in a conventional embodiment separately provided with circuitry for collective writing.

Briefly describing the semiconductor memory device in accordance with a second aspect of the present invention, which allows data input/output for every two bits, in the collective writing mode, a column select circuit renders all column select gates conductive and a write circuit collectively writes data row by row through the column select gates. Therefore, the layout area is smaller as in the case of the semiconductor memory device of the first aspect.

Preferably, the write circuit inverts and writes one of two-bit external data in response to the indication of an invert writing. Therefore, in a compress mode as well, different data can be written to two adjacent memory cells to test the influence of interference between two memory cells.

Preferably, one bit line pair out of two sets of bit line pairs and a corresponding data input/output line pair are connected in a positive phase by a second column select gate and in a negative phase by a third column select gate, and the column select circuit renders conductive the third column select gate instead of the second column select gate in the invert writing mode. Therefore, in the compress mode as well, different data can be written to two adjacent memory cells to test the influence between interference of two memory cells.

Briefly describing the semiconductor memory device in accordance with a third aspect of the present invention, which has a first mode for allowing data input/output for every N bits and a second mode for allowing data input/output for every M (M>N) bits, the column select circuit renders conductive all column select gates and the write circuit collectively writes data row by row through the column select gates when the collective writing mode is taken. Therefore, the layout area is smaller as in the cases of the semiconductor memory devices of the first and second aspects.

Preferably, the column select circuit selects M word lines no matter whether the first or the second mode is set in the collective writing mode. Therefore, data can be written more quickly.

Preferably, the write circuits of the semiconductor memory devices of the first to third aspects each include a first charge/discharge circuit charging/discharging a data input/output line according to external data and a second charge/discharge circuit activated in the collected writing mode and charging/discharging the data input/output line together with the first charge/discharge circuit. Therefore, the charging/discharging capability can be improved more in the collective write mode than in normal operation and it is not insufficient even in the collective writing mode.

Preferably, the write circuits of the semiconductor memory devices of the first to third aspects each charge/discharge the data input/output line for a first time period normally and for a second time period longer than the first time period in the collective writing mode, according to the external data. Therefore, the data input/output line can be charged/discharged sufficiently even in the collective writing mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
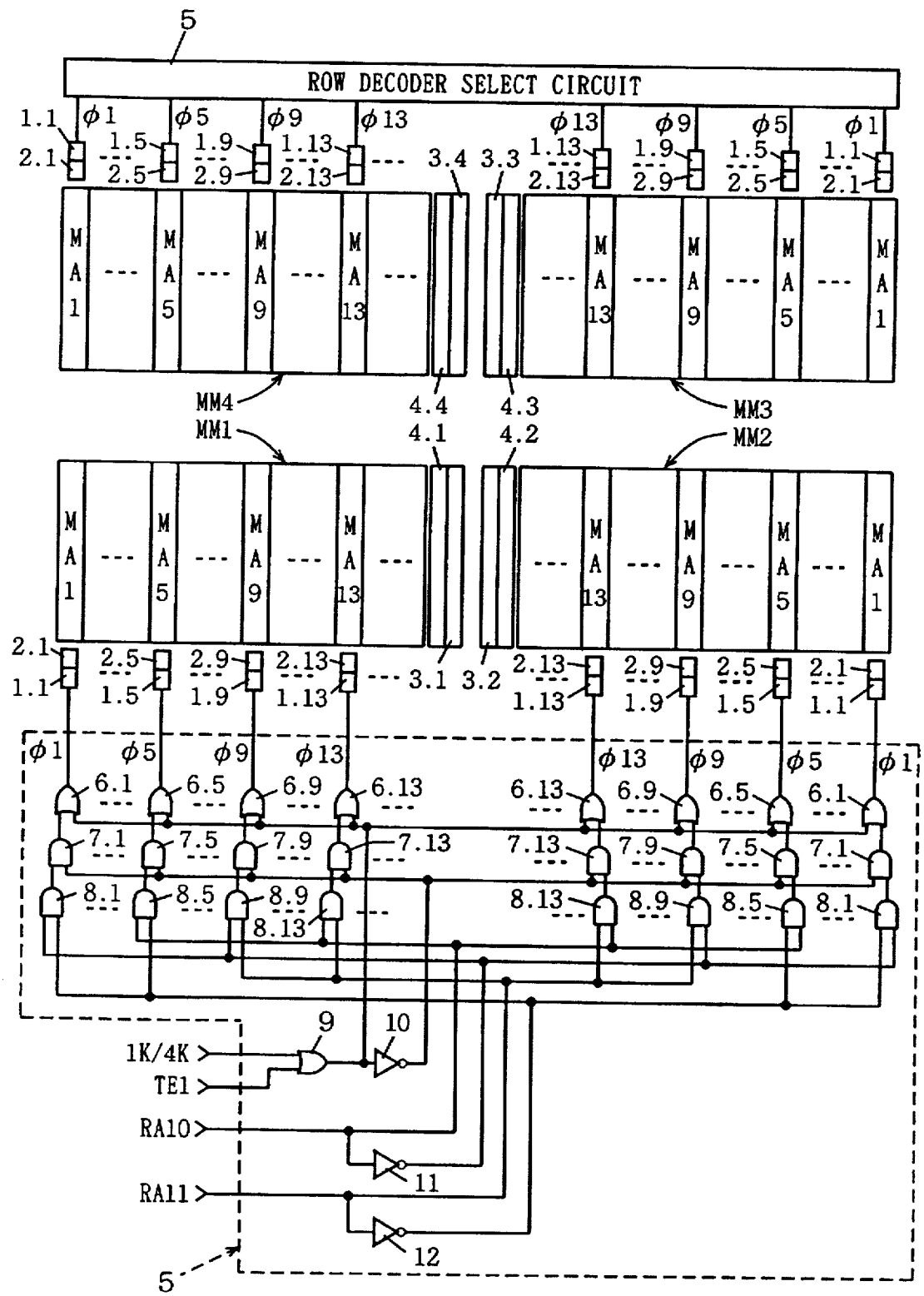
FIG. 1 is a partially omitted circuit block diagram showing a structure of a DRAM in accordance with a first embodiment of the present invention.

FIG. 1 is a circuit block diagram showing a structure of a DRAM in accordance with a first embodiment of the present invention.

Referring to FIG. 1, the DRAM includes four memory mats MM1 to MM4, and each one of four memory mats MM1 to MM4 has sixteen memory arrays MA1 to MA16. Row decoders 1.1 to 1.16 and word drivers 2.1 to 2.16 are provided corresponding to memory arrays MA1 to MA16, column predecoders 3.1 to 3.4 and column decoders 4.1 to 4.4 are provided corresponding to memory mats MM1 to MM4, and a row decoder select circuit 5 is provided commonly to memory mats MM1 to MM4.

Row decoder select circuit 5 includes OR gates 6.1 to 6.16, AND gates 7.1 to 7.16 and AND gates 8.1 to 8.16 provided corresponding to memory arrays MA1 to MA16, and an OR gate 9 and inverters 10 to 12 provided commonly to memory mats MM1 to MM4.

OR gate 9 receives a mode switch signal 1K/4K for switching between a 1K mode and a 4K mode, and a test signal TE1 for setting a collective writing mode. The 1K mode is a mode for selecting four memory arrays MA for each one of memory mats MM1 to MM4. The 4K mode is a mode for selecting one memory array MA for each one of memory mats MM1 to MM4. The collective writing mode is for writing data on a per row basis. An output of OR gate is directly input to one input node of each one of OR gates 6.1 to 6.16 and input to one input node of each one of AND gates 7.1 to 7.16 through inverter 10.

An address signal RA10 is directly input to one input node of each one of AND gates 8.5 to 8.8, 8.13 to 8.16 and input to AND gates 8.1 to 8.4, 8.9 to 8.12 through inverter 11. An address signal RA11 is directly input to the other input node of each one of AND gates 8.9 to 8.16 and input to AND gates 8.1 to 8.8 through inverter 12.

Outputs of AND gates 8.1 to 8.16 are input to the other input node of each one of AND gates 7.1 to 7.16, respectively, and outputs of AND gates 7.1 to 7.16 are input to the other input node of each one of OR gates 6.1 to 6.16, respectively. Outputs of OR gates 6.1 to 6.16, that is, row decoder select signals $\phi1$ to $\phi16$ are input to row decoders 1.1 to 1.16, respectively.

In the 1K mode, mode switch signal 1K/4K is set to the "H" level, and all outputs $\phi1$ to $\phi16$ of OR gates 6.1 to 6.16 attain the "H" level. As a result, all row decoders 1.1 to 1.16 are selected.

In the 4K mode, mode switch signal 1K/4K is set to the "L" level, and outputs of AND gates 8.1 to 8.16 are input, as they are, to corresponding row decoders 1. If address signals RA10, RA11 are 0.0; 0.1; 1.0; 1.1, respective signals $\phi1$ to $\phi4$, $\phi5$ to $\phi8$, $\phi9$ to $\phi12$, $\phi13$ to $\phi16$ are at the "H" level, so that respective row decoders 1.1 to 1.4, 1.5 to 1.8, 1.9 to 1.12, 1.13 to 1.16 are selected.

In the (collective writing mode, test signal TE1 is set to the "H" level, and all outputs $\phi1$ to $\phi16$ of OR gates 7.1 to 7.16 attain the "H" level no matter whether the 1K mode or the 4K mode is set, so that all row decoders 1.1 to 1.16 are selected.

In each one of the 1K mode, the 4K mode and the collective writing mode, respective row decoders 1.1, 1.5, 1.9, 1.13; 1.2, 1.6, 1.10, 1.14; 1.3, 1.7, 1.11. 1.15; 1.4, 1.8, 1.12, 1.16 are further selected, if address signals RA8, RA9 are 0.0; 0.1; 1.0; 1.1. Only row decoder 1 selected by row decoder select circuit 5 and address signals RA8, RA9 is activated, and that activated row decoder 1 selects one word line WL in corresponding memory array MA according to address signals RA0 to RA7. Word driver 2 raises that word line WL which is selected by corresponding row decoder 1 to the selected "H" level for a prescribed time period.

Figure 2:
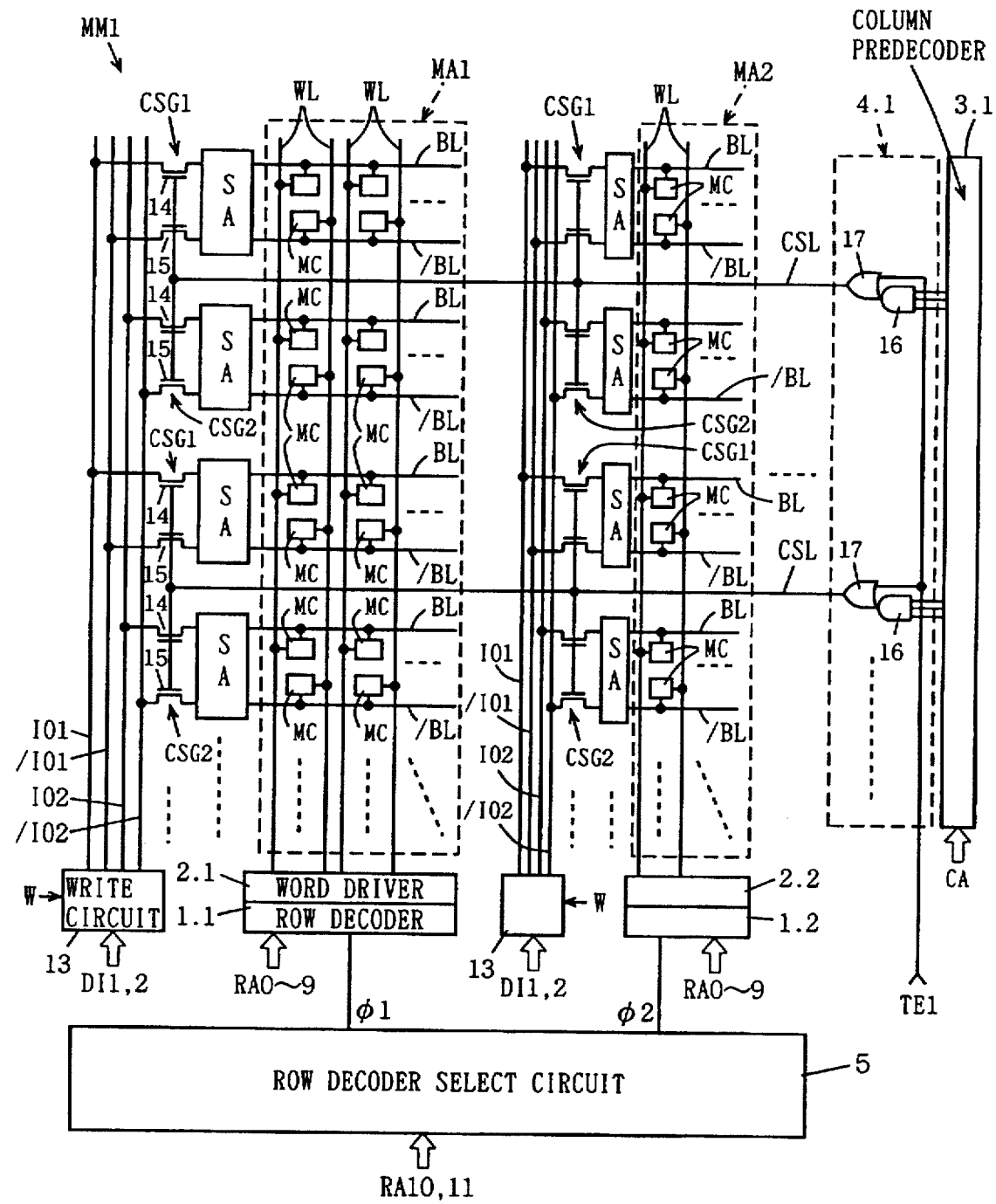
FIG. 2 is a partially omitted circuit block diagram showing, in more detail, a structure of a portion related to the memory mat MM1 shown in FIG. 1.

FIG. 2 is a partially omitted circuit block diagram showing, in more detail, a structure of a portion related to memory mat MM1.

Referring to FIG. 2, memory arrays MA1 to MA16 each include a plurality of memory cells MC arranged in row and column directions, word line WL provided corresponding to each row, and bit line pair BL, /BL provided corresponding to each column. Memory cell MC is a conventional one including an N channel MOS transistor for access and a capacitor for storing data.

Sense amplifier SA is provided corresponding to each bit line pair BL, /BL. Column select gates CSG1, CSG2 and column select line CSL are provided corresponding to two adjacent pairs of bit lines BL, /BL. Data input/output line pairs IO1, /IO1; IO2, /IO2 and write circuit 13 are provided corresponding to each memory array MA. Column select line CSL1 is provided commonly to memory arrays MA1 to MA16. For simplicity of the drawing, the read circuit is omitted.

During the reading operation, sense amplifier SA amplifies a slight potential difference caused between paired bit lines BL, /BL to power supply voltage Vcc according to data of selected memory cell MC. Column select gates CSG1, CSG2 each include N channel MOS transistors 14, 15. N channel MOS transistors 14, 15 of column select gate CSG1 are connected between one bit line pair BL, /BL of the two adjacent pairs of bit lines BL, /BL and data input/output line pair IO1, /IO1, respectively. N channel MOS transistors 14, 15 of column select gate CSG2 is connected between the other bit line pair BL, /BL of the two adjacent pairs of bit lines BL, /BL and data input/output line pair IO2, /IO2, respectively. N channel MOS transistors 14, 15 of column select gates CSG1, CSG2 have their gates connected to column decoder 4.1 through column select line CSL.

Column predecoder 3.1 predecodes an externally supplied column address signal CA to generate a column predecode signal and supplies it to column decoder 4.1. Column decoder 4.1 includes a column decoder unit circuit 16 and an OR gate 17 provided corresponding to each column select line CSL. The column predecode signal has been assigned to each column decoder unit circuit 16 beforehand. Each column decoder unit circuit 16 outputs an "H" level signal in response to reception of the preassigned column predecode signal from column predecoder 3.1. Each OR gate 17 receives test signal TE1 and the output of corresponding column decoder unit circuit 16, and has its output node connected to column select line CSL.

In the collective writing mode, test signal TE1 is set to the active "H" level. In this case, output nodes of all OR gates 17, that is, all column select lines CSL attain the "H" level regardless of column address signal CA, and all column select gates CSG1, CSG2 are rendered conductive.

In the normal operation mode, test signal TE1 is set to the inactive "L" level. In this case, only one column select line CSL designated by column address signal CA attains the "H" level, and only column select gates CSG1, CSG2 corresponding to that column select line CSL are rendered conductive.

In response to a write control signal W, write circuit 13 writes externally supplied two data DI1, DI2 to two selected memory cells MC through data input/output line pairs IO1,/IO1; IO2,/IO2. Since other memory mats MM2, MM3 are of the same structure as memory mat MM1, their description will not be repeated.

Next, the writing operation of the DRAM will be briefly described. In the 1K mode, mode switch signal 1K/4K is set to the "H" level, and test signal TE1 is set to the inactive "L" level. In this case, column decoder 4.1 operates as usual. In short, column select line CSL designated by column address signal CA is raised to the selected "H" level by column decoder 4.1, and column select gates CSG1, CSG2 of memory arrays MA1 to MA16 corresponding to that column select lines CSL are rendered conductive. Then, potentials of data input/output lines IO1, /IO1, IO2, /IO2, and bit lines BL, /BL electrically connected to the data input/output lines are raised or lowered by write circuit 13 to a potential according to data DI1, DI2, that is, power supply potential Vcc or ground potential GND.

On the other hand, the output of OR gate 9 in row decoder select circuit 5 is at the "H" level, and all row decoder select signals $\phi 1$ to $\phi 16$ attain the "H" level regardless of address signals RA10, RA11, so that row decoders 1.1 to 1.16 are selected. Address signals RA8, RA9 select one row decoder 1 out of each group of row decoders 1.1 to 1.4, 1.5 to 1.8, 1.9 to 1.12, 1.13 to 1.16. Four row decoders (for example 1.1, 1.5, 1.9, 1.13) selected by row decoder select circuit 5 and address signals RA8, RA9 each select one word line WL of corresponding memory arrays (MA1, MA5, MA9, MA13 in this case) according to address signals RA0 to RA7. Selected word line WL is raised to the selected "H" level by word drivers 2.1, 2.5, 2.9, 2.13 to activate each memory cell MC corresponding to each word line WL. To a capacitor of an activated memory cell array, the potential of bit line BL or /BL electrically connected to data input/output lines IO1, /IO1, IO2 or /IO2 is written in the form of charges.

In the 4K mode, mode switch signal 1K/4K is set to the "L" level, and test signal TE1 is set to the inactive "L" level. In this case, signals of one group (for example $\phi 1$ to $\phi 4$) out of four groups of signals $\phi 1$ to $\phi 4$, $\phi 5$ to $\phi 8$, $\phi 9$ to $\phi 12$, $\phi 13$ to $\phi 16$ attain the "H" level according to address signals RA10, RA11, and row decoders (1.1. to 1.4 in this case) are selected. Address signals RA8, RA9 select one row decoder 1 out of each group of row decoders 1.1 to 1.4, 1.5 to 1.8, 1.9 to 1.12, 1.13 to 1.16. One row decoder (for example 1.1) selected by row decoder select circuit 5 and address signals RA8, RA9 selects one word line WL in a corresponding memory array (MA1 in this case) according to address signals RA0 to RA7. Selection of column select line CSL and writing by write circuit 13 are carried out as in the 1K mode.

In the collective writing mode, test signal TE1 is set to the active "H" level. In this case, the output of OR gate 9 of row decoder select circuit 5 attains the "H" level regardless of the setting of the 1K mode or the 4K mode, so that word line WL is selected as in the 1K mode. In short, four memory arrays MAs are selected in each memory mat MM, and one word line WL is selected in each selected memory array MA.

On the other hand, the output of OR gate 17 of column decoder 4 is at the "H" level regardless of the column predecode signal from column predecoder 3, and all column select lines CSLs attain the "H" level. Therefore, all column select gates CSG1, CSG2 are rendered conductive. In response to write control signal W, each write circuit 13 writes data to all memory cells MC connected to selected word lines WL.

In this embodiment, all column select gates CSG1, CSG2 are rendered conductive to write data row by row in the collective writing mode. Therefore, test pattern write circuit 115 and test pattern write control gate 17 which are separately provided are not necessary, and thus the layout area is reduced.

In addition, the collective writing mode allows the word selecting operation as is in the 1K mode no matter whether the DRAM is set to the 1K mode or the 4K mode. Therefore, data can be collectively written to larger number of rows, more quickly.

Figure 8:
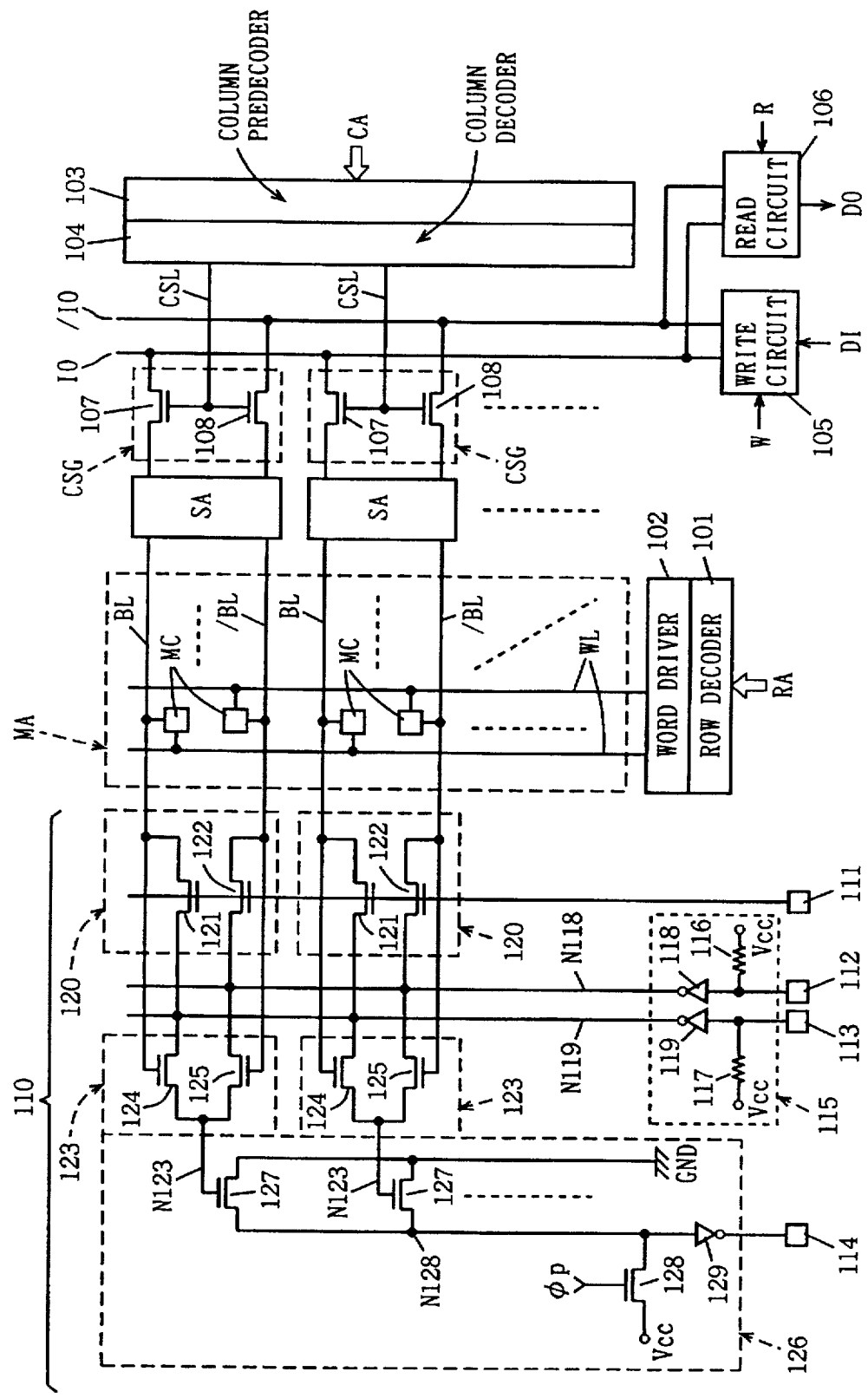
FIG. 8 is a partially omitted circuit block diagram showing a structure of a conventional DRAM.

Here, whether collectively written memory cells MC are defective or not is determined, for example, by reading data of each memory cell MC to each bit line BL,/BL, sequentially reading the data of each two sets of bit line pairs BL, /BL to data input/output line pairs IO1, /IO1; IO2, /IO2, sequentially detecting if data input/output line pairs IO1 and /IO1 or IO2 and /IO2 have the same data, and determining if each memory cell MC is normal or not, based on the detection. The determination may be performed in the conventional manner by separately providing comparison circuit 123, OR gate 126 and so on, shown in FIG. 8.

[Second Embodiment]

Conventionally, this type of DRAM is provided with a compress mode in which a plurality of data input/output terminals are compressed to one in order to further improve test efficiency. In this mode, two same pieces of data DI1 are given to write circuit 13, and the same data DI1 is written to all memory cells MC. Therefore, the influence of interference between memory cells MC when different data is written to each one of two adjacent memory cells MC cannot be tested in this mode. This embodiment aims to solve the problem.

Figure 3:
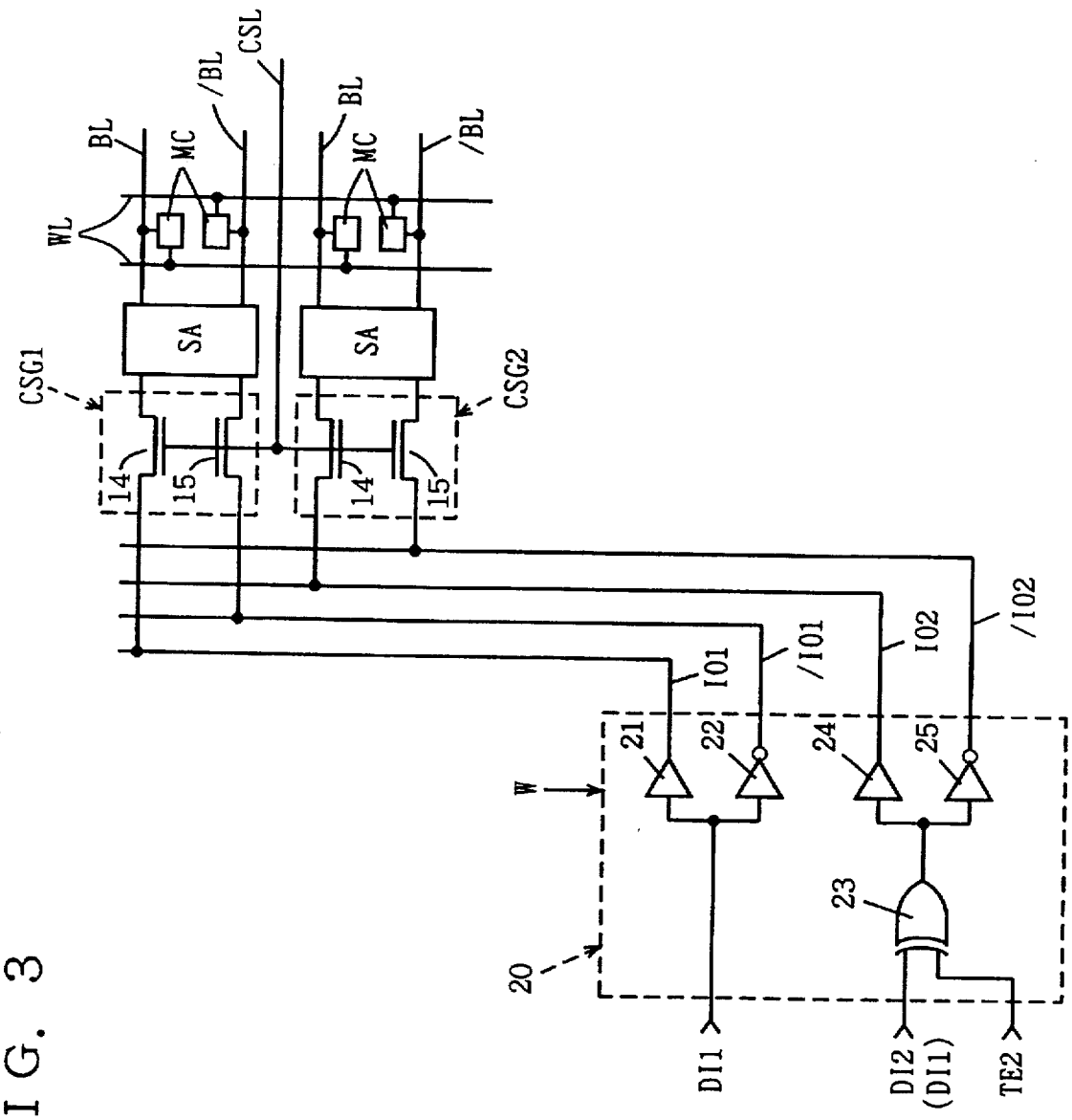
FIG. 3 is a partially omitted circuit block diagram showing a structure of a write circuit in a DRAM in accordance with a second embodiment of the present invention.

FIG. 3 is a circuit block diagram showing a structure of a write circuit 20 of a DRAM in accordance with a second embodiment of the present invention.

Referring to FIG. 3, write circuit 20 includes buffers 21, 24, inverters 22, 25 and EX-OR gate 23. Write circuit 20 receives two pieces of data DI1, DI2 normally and receives two same pieces of data DI1, DI1 in the compress mode. Buffer 21 receives data DI1, and its output node is connected to data input/output line IO1. Inverter 22 receives data DI1, and its output node is connected to data input/output line /IO1. EX-OR gate 23 receives data DI2 (DI1) and a test signal TE2 for setting an invert writing mode. The invert writing mode is a mode which inverts and writes input data DI2 (DI1). EX-OR gate 23 has its output input to buffer 24 and inverter 25. Output nodes of buffer 24 and inverter 25 are connected to data input/output lines IO2, /IO2, respectively. Buffers 21, 24 and inverters 22, 25 are all activated by write control signal W.

Next, operation of write circuit 20 will be described. In the normal operation, test signal TE2 is set to the "L" level. In this case, data DI2 (DI1) is input, as it is, to buffer 24 and inverter 25. Therefore, the same levels as data DI1, DI2 (DI1) are transmitted to data input/output lines IO1, IO2, respectively, and the inverted levels of the levels of data DI1, DI2 (DI1) are transmitted to data input/output lines /IO1, /IO2, respectively.

In the invert writing mode, test signal TE2 is set to the "H" level. In this case, inverted data DI2 (DI1) is input to buffer 24 and inverter 25. Therefore, the same levels as data DI1, DI2 (DI1) are transmitted to data input/output lines IO1, /IO2, respectively, and the inverted levels of the levels of data DI1, DI2 (DI1) are transmitted to data input/output lines /IO1, IO2, respectively. Other structure and operation are the same as in the DRAM. of the first embodiment.

This embodiment provides the same result as the first embodiment. Even in the compress mode, different data can be written to memory cells MC, and the influence of interference between two adjacent memory cells MC can be tested.

[Third Embodiment]

Figure 4:
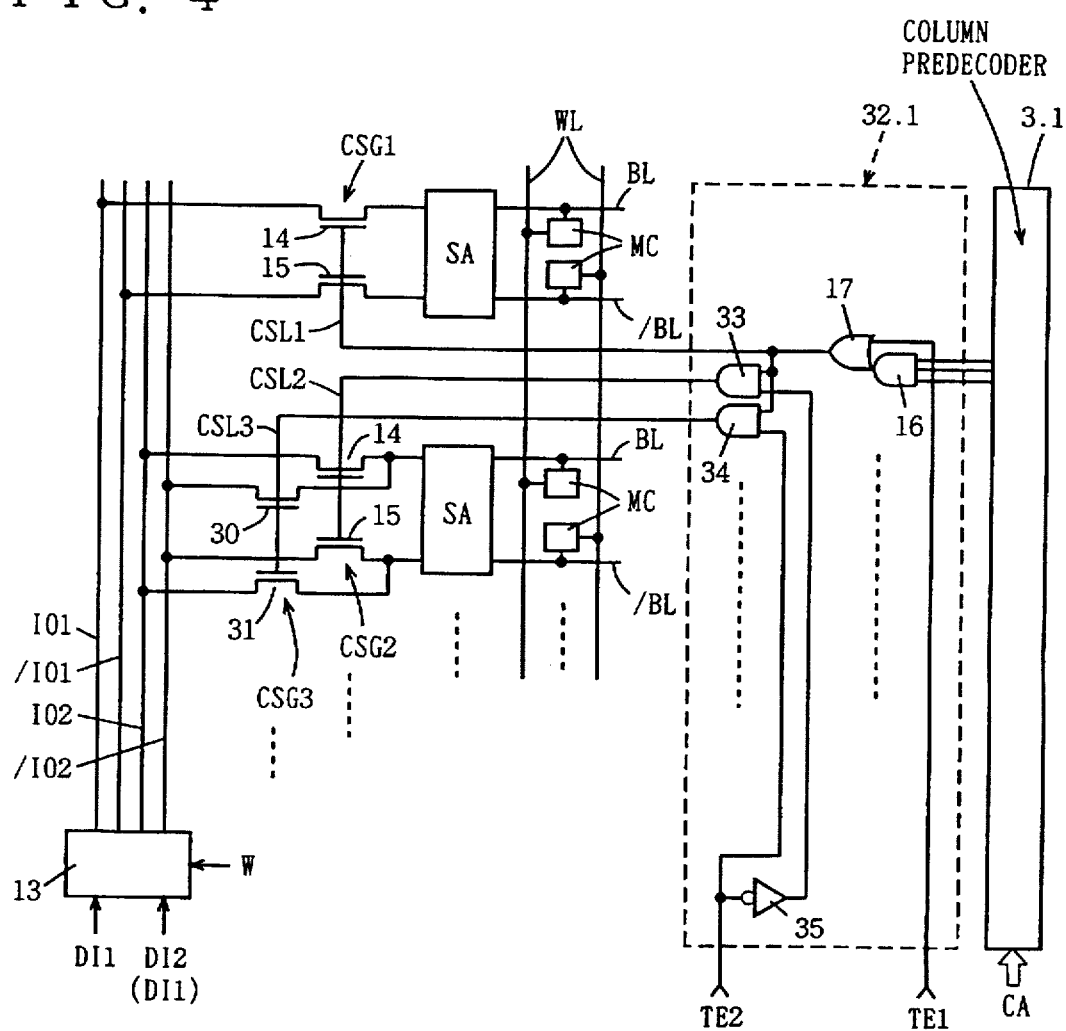
FIG. 4 is a circuit block diagram showing a structure of a principal part of a DRAM in accordance with a third embodiment of the present invention.

FIG. 4 is a circuit block diagram showing a principal part of a DRAM in accordance with a third embodiment of the present invention.

Referring to FIG. 4, this DRAM is different from the DRAM in the first embodiment in that a column select gate CSG3 is newly provided corresponding to a group of two adjacent pairs of bit lines BL, /BL, three column select lines CSL1 to CSL3 are provided instead of column select line CSL, and column decoders 32.1 to 32.4 replace respective column decoders 4.1 to 4.4.

Column select gate CSG3 includes N channel MOS transistors 30, 31. N channel MOS transistor 30 is connected between data input/output lines /IO2 and bit line BL, and 14 channel MOS transistor 31 is connected between data input/output line IO2 and bit line /BL.

Beside column decoder unit circuit 16 and OR gate 17, column decoders 32.1 to 32.4 each include AND gates 33, 34 and an inverter 35 provided corresponding to each group of two adjacent pairs of bit lines BL, /BL. The output of OR gate 17 is input to gates of N channel MOS transistors 14, 15 of column select gates CSG1 through column select line SCL1 and input to one input node of each one of AND gates 33, 34. Test signal TE2 for setting the invert writing mode discussed in the second embodiment is directly input to the other input node of AND gate 34 and input to the other input node of AND gate 33 through inverter 35. An output of AND gate 33 is input to gates of N channel MOS transistors 14, 15 of column select gate CSG2 through column select line CSL2. An output of AND gate 34 is input to gates of N channel MOS transistor 30, 31 of column select gate CSG3 through column select line CSL3.

Next, operation of the DRAM will be described. In the normal operation, test signal TE2 is set to the "L" level. In this case, the output of AND gate 34 is fixed to the "L" level, and column select gate CSG3 is fixed to the non-conductive state. AND gate 33 passes the output of OR gate 17, as it is, to column select line CSL2. Therefore, when the output of OR gate 17 attains the selected "H" level, column select gates CSG1, CSG2 are rendered conductive, so that data input/output line pair IO1, /IO1 is connected in the positive phase to bit line pair BL, /BL through column select gate CSG1, and data input/output line pair IO2, /IO2 is connected in the positive phase to bit line pair BL, /BL through column select gate CSG2. Therefore, data DI1, DI2 are written, as they are, to corresponding memory cells MC.

In the invert writing mode, test signal TE2 is set to the "H" level. In this case, the output of AND gate 33 is fixed to the "L" level and column select gate CSG2 is fixed to the non-conductive state. AND gate 34 passes the output of OR gate 17, as it is, to column select line CSL3. Therefore, when the output of OR gate 17 attains the selected "H" level, column select gates CSG1, CSG3 are rendered conductive, so that data input/output line pair IO1, /IO1 is connected in the positive phase to bit line pair BL, /BL through column select gate CSG1, and data input/output line pair IO2, /IO2 is connected in the negative phase to bit line pair BL, /BL through column select gate CSG3. Therefore, data DI1 is written, as it is, to corresponding memory cell MC whereas data DI2 is inverted and written to corresponding memory cell MC.

This embodiment also provides the same result as the second embodiment.

[Fourth Embodiment]

Figure 5:
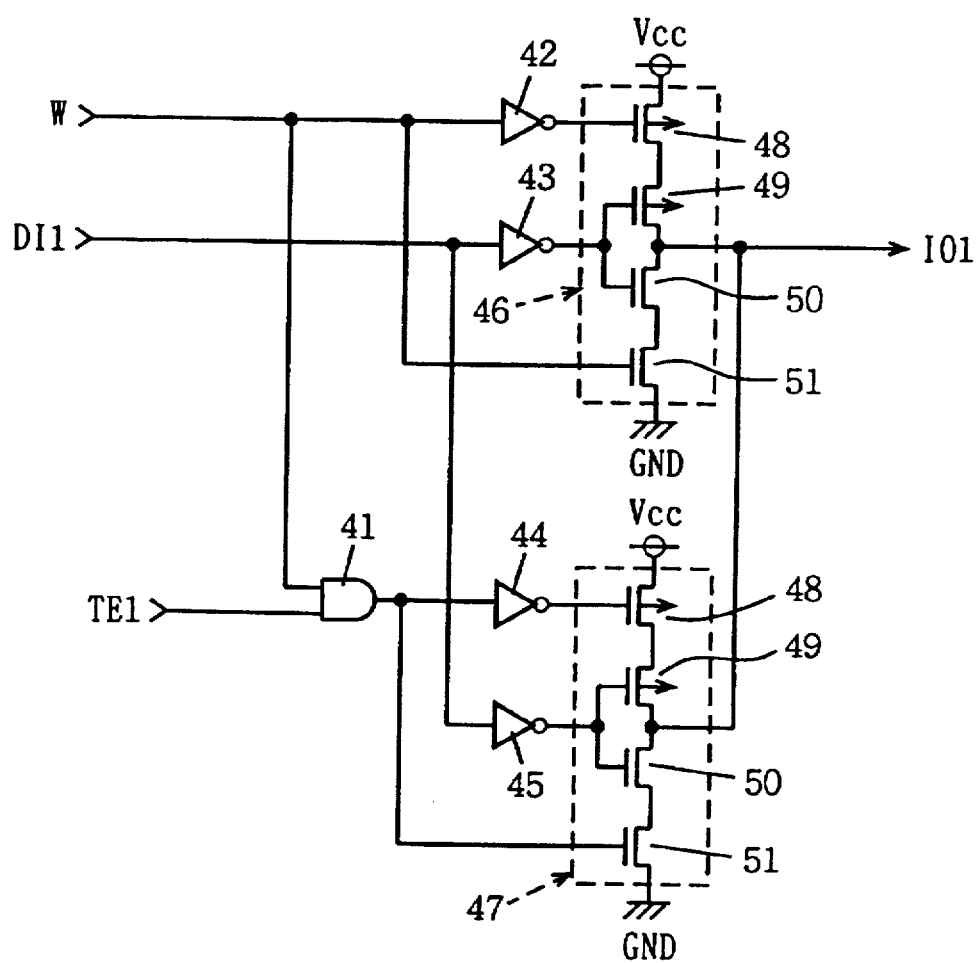
FIG. 5 is a circuit block diagram showing a structure of a charge/discharge circuit included in a write circuit in a DRAM in accordance with a fourth embodiment of the present invention.

FIG. 5 is a circuit block diagram showing a principal part of a write circuit of a DRAM in accordance with a fourth embodiment of the present invention.

Referring to FIG. 5, the write circuit includes charge/discharge circuits 40.1 to 40.4 provided corresponding to data input/output lines IO1, /IO1, IO2, /IO2, respectively.

Charge/discharge circuit 40.1 includes an AND gate 41, inverters 42 to 45 and switching inverters 46, 47. Switching inverters 46, 47 each include P channel MOS transistors 48, 49 and N channel MOS transistors 50, 51 connected in series between a line of power supply potential Vcc and a line of ground potential GND. MOS transistors 49, 50 have their drains connected to data input/output line IO1. Write control signal W is input to a gate of P channel MOS transistor 48 of switching inverter 46 through inverter 42 and input to N channel MOS transistor 51 of switching inverter 46 directly.

Data DI1 is input to gates of MOS transistors 49, 50 of switching inverter 46 through inverter 43 and input to gates of MOS transistors 49, 50 of switching inverter 47 through inverter 44. AND gate 41 receives write control signal W and test signal TE1 for setting the collective writing mode. An output of AND gate 41 is input to a gate of P channel MOS transistor 48 of switching inverter 47 through inverter 44 and input to a gate of N channel MOS transistor 51 of switching inverter 47 directly.

Charge/discharge circuit 40.3 is of the same structure as charge/discharge circuit 40.1 except that it receives data DI2 instead of data DI1. Charge/discharge circuit 40.2 corresponds to charge/discharge circuit 40.1 with inverters 43, 44 removed. Charge/discharge circuit 40.4 corresponds to charge/discharge circuit 40.3 with inverters 43, 45 removed.

Next, operation of the write circuit will be described. In the normal operation, test signal TE1 is set to the "L" level. In this case, the output of AND gate 41 is fixed to the "L" level, and switching inverter 47 is fixed to the inactive state. Therefore, charging/discharging of data input/output lines IO1, /IO1, IO2, /IO2 is carried out only by switching inverter 46.

In charge/discharge circuit 40.1, for example, the active "H" level of write control signal W for a prescribed time period renders conductive MOS transistors 48, 51 of switching inverter 46, activating switching inverter 46. If data DI1 is at the "H" level ("1"), P channel MOS transistor 49 and N channel MOS transistor 50 of switching inverter 46 are conductive and non-conductive, respectively, charging data input/output line IO1 to the "H" level. If data DI1 is at the "L" level ("0"), P channel MOS transistor 49 and N channel MOS transistor 50 of switching inverter 46 are non-conductive and conductive, respectively, discharging data input/output line IO1 to the "L" level.

In the collective writing mode, test signal TE1 is set to the "H" level. In this case, AND gate 41 passes write control signal W as it is. Therefore, charging/discharging of data input/output lines IO1, /IO1, IO2, /IO2 is carried out by two switching inverters 46, 47.

In charge/discharge circuit 40.1, for example, the active "H" level of write control signal W for a prescribed time period renders conductive MOS transistors 48, 51 of switching inverter 46, 47, activating switching inverters 46, 47. If data DI1 is at the "H" level, P channel MOS transistors 49 and N channel MOS transistors 50 of switching inverters 46, 47 are conductive and non-conductive, respectively, charging data input/output line IO1 to the "H" level. If data DI1 is at the "L" level, P channel MOS transistors 49 and N channel MOS transistors 50 of switching inverters 46, 47 are non-conductive and conductive, respectively, discharging data input/output line IO1 to the "L" level.

Since other structure and operation are as in the DRAM of the first embodiment, their description will not be repeated.

This embodiment provides the same result as the first embodiment. Since the charging/discharging capability of charge/discharge circuits 40.1 to 40.4 is increased more in the collective writing mode than in the normal mode, the levels of data input/output lines IO1, /IO1, IO2, /IO2 can be raised or lowered to sufficient levels even in the collective writing mode.

[Fifth Embodiment]

Figure 6:
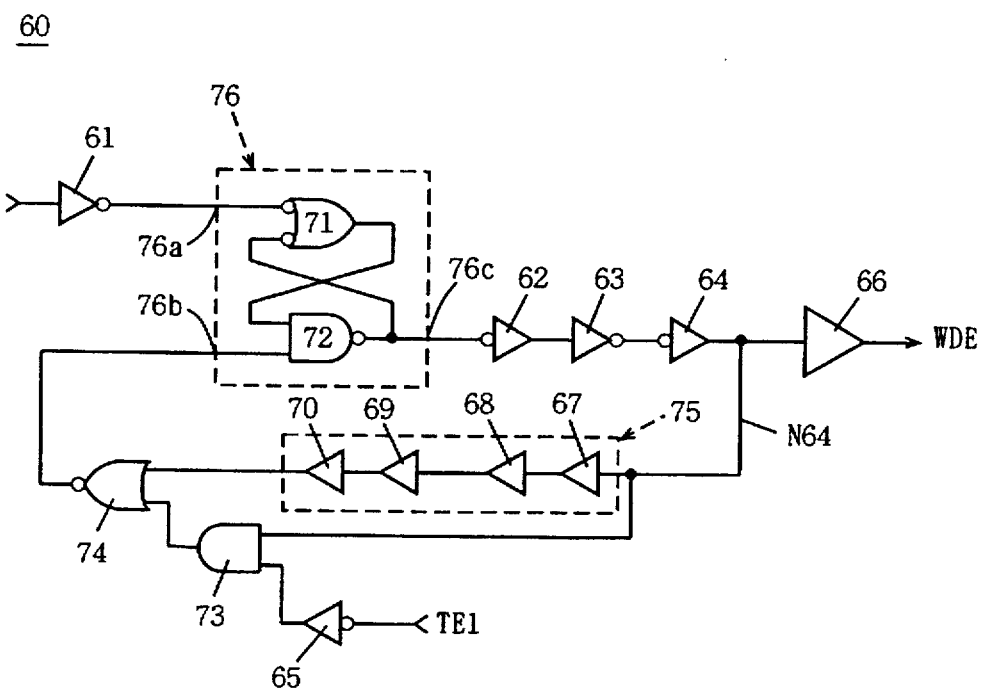
FIG. 6 is a circuit block diagram showing a structure of a write time control circuit in a DRAM in accordance with a fifth embodiment of the present invention.

FIG. 6 is a circuit block diagram showing a structure of a principal part of a DRAM in accordance with a fifth embodiment of the present invention.

Referring to FIG. 6, this DRAM differs from the DRAM of the first embodiment in that a write time control circuit 60 is newly provided. Write time control circuit 60 includes inverters 61 to 65, buffers 66 to 70, NAND gates 71, 72, an AND gate 73 and a NOR gate 74. Serially connected buffers 67 to 70 constitute a delay circuit 75, and NAND gates 71, 72 constitute a flipflop 76.

Write control signal W is input to a set terminal 76a of flipflop 76 through inverter 61. Inverters 62 to 64 are connected in series between an inverted output terminal 76c of flipflop 76 and a node N64. An output of inverter 64 is input to buffer 66, and an output of buffer 66 serves as a write time control signal WTE. Write time control signal WTE determines the write time of the write circuit and it, is input to the write circuit instead of write control signal W.

The output of inverter 64 is input to one input node of NOR gate 74 through delay circuit 75 and to one input node of AND gate 73. Signal TE1 for setting the collective writing mode is input to the other input node of AND gate 73 through inverter 65. An output of AND gate 73 is input to the other input node of NOR gate 74. An output of NOR gate 74 is input to a reset terminal 76b of flipflop 76.

Figure 7A:
FIGS. 7A to 7C are timing charts showing operation of the write time control circuit shown in FIG. 6.

Next, operation of write time control circuit 60 will be described. In the normal operation, test signal TE1 is set to the "L" level as shown by a dotted line in FIG. 7B. In this case, AND gate 73 passes the output of inverter 64 to NOR gate 74 as it is. When write control signal W rises to the active "H" level as shown in FIG. 7A, flipflop 76 is set and inverted output terminal 76c of flipflop 76 falls to the "L" level. Accordingly, the output of inverter 64 rises to the "H" level, and write time control signal WDE rises to the active "H" level as shown in FIG. 7C. The output of inverter 64 is input to NOR gate 74 after passing through AND gate 73. Accordingly, the output of NOR gate 74 rises to the "L" level and flipflop 76 is reset. Thus, inverted output terminal 76c of flipflop 76 rises to the "H" level and the output of inverter 64 falls to the "L" level. Thus, signal WDE falls to the "L" level as shown by a dotted line in FIG. 7C.

Figure 7B:
Figure 7C:

In the collective writing mode, test signal TE1 is set to the "H" level as shown in a solid line in FIG. 7B. In this case, the output of AND gate 73 is fixed to the "L" level. Therefore, the output of inverter 64 is input to NOR gate 74 through delay circuit 75. Therefore, in the collective writing mode, the time period between set and reset of flipflop 76 is longer, and a pulse width of write time control signal WDE becomes wider as shown by a solid line in FIG. 7C. Other structure and operation are the same as described in the DRAM of the first embodiment.

In this embodiment, the same result as the first embodiment is obtained, and the write time of the write circuit is increased more in the collective writing mode than in normal operation. Therefore, the levels of data input/output lines IO1, /IO1, IO2, /IO2 can be raised or lowered to the efficient levels even in the collective writing mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a collective writing mode for writing data on a per row basis, comprising:

a memory array including a plurality of memory cells arranged in a matrix, word lines provided corresponding to respective rows, and bit line pairs provided corresponding to respective columns;

a data input/output line pair for inputting/outputting data to and from said memory array;

a column select gate provided corresponding to each bit line pair and connected between a corresponding bit line pair and one end of said data input/output line pair;

row selecting means for selecting one word line in said memory array according to a row address signal;

column selecting means for selecting one bit line pair in said memory array according to a column address signal and rendering conductive a column select gate corresponding to the bit line pair; and writing means connected to another end of said data input/output line pair for writing externally supplied data to a memory cell corresponding to the word line selected by said row selecting means through the bit line pair selected by said column selecting means, wherein said column selecting means selects all bit line pairs in said memory array in response to indication of said collective writing mode and renders conductive a column select gate corresponding to each selected bit line pair.

2. The semiconductor memory device according to claim 1, wherein said writing means includes:

first charging/discharging means provided corresponding to each data input/output line for charging/discharging a corresponding data input/output line according to said externally supplied data, and second charging/discharging means provided corresponding to each data input/output line for charging/discharging a corresponding data input/output line together with said first charging/discharging means in response to indication of said collective writing mode.

3. The semiconductor memory device according to claim 1, wherein said writing means includes charging/discharging means provided corresponding to each data input/output line for charging/discharging a corresponding data input/output line normally for a first time period and for charging/discharging a corresponding data input/output line for a second time period longer than said first time period in response to indication of said collective writing mode, in accordance with said externally supplied data.

4. A semiconductor memory device having a collective writing mode for writing data on a per row basis, comprising:

a memory array including a plurality of memory cells arranged in a matrix, word lines provided corresponding to respective rows, and bit line pairs provided corresponding to respective columns, every two adjacent pairs of bit lines being grouped in advance;

two data input/output line pairs each inputting/outputting data to and from said memory array;

first and second column select gates provided corresponding to a group of said two adjacent bit line pairs and each connected between a corresponding group of two bit line pairs and one end of said two data input/output line pairs;

row selecting means for selecting one word line in said memory array according to a row address signal;

column selecting means for selecting one group of two bit line pairs in said memory array according to a column address signal and rendering conductive the first and second column select gates corresponding to the group; and writing means connected to another end of said two data input/output line pairs for writing externally supplied two-bit data to two memory cells corresponding to the word line selected by said row selecting means through the group of two bit line pairs selected by said column selecting means, wherein said column selecting means selects all groups in said memory array in response to indication of said collective write mode and renders conductive the first and second column select gates corresponding to each selected group.

5. The semiconductor memory device according to claim 4, wherein said writing means inverts and writes one data out of said externally supplied two-bit data in response to indication of an invert writing mode.

6. The semiconductor memory device according to claim 4, further comprising:

a third column select gate provided corresponding to one bit line pair of each group of two bit line pairs and connected between a corresponding bit line pair and one end of a corresponding data input/output line pair, wherein each group of two bit line pairs and said two data input/output line pairs are connected in a positive phase by said first and second column select gates, respectively, one bit line pair of each group of two bit line pairs and a corresponding data input/output line pair are connected in a negative phase by said third column select gate, and said column selecting means renders conductive said third column select gate instead of said second column select gate in response to indication of an invert writing mode.

7. The semiconductor memory device according to claim 4, wherein said writing means includes:

first charging/discharging means provided corresponding to each data input/output line for charging/discharging a corresponding data input/output line according to one of said externally supplied two-bit data, and second charging/discharging means provided corresponding to each data input/output line for charging/discharging a corresponding data input/output line together with said first charging/discharging means in response to indication of said collective writing mode.

8. The semiconductor memory device according to claim 4, said writing means includes charging/discharging means provided corresponding to each data input/output line for charging/discharging a corresponding data input/output line normally for a first time period and for charging/discharging a corresponding data input/output line for a second time period longer than said first time period in response to indication of said collective writing mode, in accordance with said externally supplied two-bit data.

9. A semiconductor memory device having a collective writing mode for writing data on a per row basis, comprising:

a plurality of memory arrays each including a plurality of memory cells arranged in a matrix, word lines provided corresponding to respective rows, and bit line pairs provided corresponding to respective columns, and arranged in a direction in which said bit line pair extends;

a column select line provided commonly to said plurality of memory arrays corresponding to each bit line pair;

a data input/output line pair provided corresponding to each memory array for inputting/outputting data to and from a corresponding memory array;

a column select gate provided corresponding to each bit line pair and connected between a corresponding bit line pair and one end of a corresponding data input/output line pair;

mode setting means for setting a first mode inputting/outputting data for every N bits or a second mode inputting/outputting data for every M bits (M>N);

row selecting means responsive to setting of said first or second mode by said mode setting means for selecting N or M memory arrays out of said plurality of memory arrays according to a row address signal and for selecting one word line in each selected memory array;

column selecting means for selecting one column select line out of said plurality of column select lines according to a column address signal and rendering conductive a column select gate corresponding to the column select line; and writing means connected to another end of each data input/output line pair for writing externally supplied data to a memory cell corresponding to the word line selected by said row selecting means through a bit line pair corresponding to the column select line selected by said column selecting means, wherein said column selecting means selects all column select lines in response to indication of said collective writing mode and rendering conductive a column select gate corresponding to each selected column select line.

10. The semiconductor memory device according to claim 9, wherein said row selecting means selects, in response to indication of said collective writing mode, M memory arrays out of said plurality of memory arrays, and selects one word line in said each selected memory array according to said row address signal.

11. The semiconductor memory device according to claim 9, wherein said writing means includes:

first charging/discharging means provided corresponding to each data input/output line for charging/discharging a corresponding data input/output line according to said externally supplied data, and second charging/discharging means provided corresponding to each data input/output line for charging/discharging a corresponding data input/output line together with said first charging/discharging means in response to indication of said collective writing mode.

12. The semiconductor memory device according to claim 9, wherein said writing means includes charging/discharging means provided corresponding to each data input/output line for charging/discharging a corresponding data input/output line normally for a first time period and for charging/discharging a corresponding data input/output line for a second time period longer than said first time period in response to indication of said collective writing mode, in accordance with said externally supplied data.

* * * * *